United States Patent [19]
Estakhri et al.

[11] Patent Number: 6,134,151
[45] Date of Patent: Oct. 17, 2000

[54] SPACE MANAGEMENT FOR MANAGING HIGH CAPACITY NONVOLATILE MEMORY

[75] Inventors: Petro Estakhri, Pleasanton; Berhanu Iman, Sunnyvale; Min Guo, Fremont, all of Calif.

[73] Assignee: Lexar Media, Inc., Fremont, Calif.

[21] Appl. No.: 09/519,226

[22] Filed: Mar. 6, 2000

Related U.S. Application Data

[63] Continuation of application No. 09/283,728, Apr. 1, 1999, Pat. No. 6,034,897.

[51] Int. Cl.$^7$ .................................................. G11C 16/04
[52] U.S. Cl. ............................... 365/185.33; 365/185.29; 365/218; 365/230.03
[58] Field of Search .............................. 365/185.29, 218, 365/185.33, 230.03

[56] References Cited

U.S. PATENT DOCUMENTS

| | | | |
|---|---|---|---|
| 4,210,959 | 7/1980 | Wozniak | 364/200 |
| 4,355,376 | 10/1982 | Gould | 365/230 |
| 4,405,952 | 9/1983 | Slakmon | 360/49 |

(List continued on next page.)

FOREIGN PATENT DOCUMENTS

| | | | |
|---|---|---|---|
| 0 557 723 | 1/1987 | Australia | G11C 5/00 |
| 0 243 503 A1 | 4/1987 | European Pat. Off. | G11B 20/10 |
| 0 220 718 A2 | 5/1987 | European Pat. Off. | G06F 15/40 |

(List continued on next page.)

OTHER PUBLICATIONS

Book—*Computer Architecture and Parallel Processing*, Kai Hwang & Faye A. Briggs, McGraw–Hill Book Co., © 1984, p. 64.

Magazine—"State of the Art: Magnetic VS. Optical Store Data in a Flash", by Walter Lahti and Dean McCarron, Byte magazine dated Nov. 1, 1990, 311, vol. 15, No. 12.

Magazine—Technology Updates, Integrated Circuits, "1–Mbit flash memories seek their role in system design", Ron Wilson, Senior Editor, Computer Design magazine 28 (1989) Mar. 1, No. 5, Tulsa OK, US, pp. 30 and 32.

1992 Symposium of VLSI Circuits Digest of Technical Papers, "EEPROM for Solid State Disk Applications", S. Mehoura et al., SunDisk Corporation, Santa Clara, CA. R. W. Gregor et al., AT&T Bell Laboratories, Allentown, PA. pp. 24 and 25.

*Primary Examiner*—Son T. Dinh
*Attorney, Agent, or Firm*—Law Office of Imam

[57] ABSTRACT

In accordance with an embodiment of the present invention, a method and apparatus is disclosed for use in a digital system having a host coupled to at least two nonvolatile memory devices. The host stores digital information in the nonvolatile memory devices and reads the stored digital information from the nonvolatile memory devices. The memory devices are organized into blocks of sectors of information. The method is for erasing digital information stored in the blocks of the nonvolatile memory devices and comprises assigning a predetermined number of blocks, in sequential order, to each of the nonvolatile memory devices, each block having a predetermined number of sectors. The method further comprises forming 'super' blocks, each 'super' block comprising a plurality of blocks, identifying a particular 'super' block having at least two blocks, a first block being located in a first nonvolatile memory device and a second block being located in a second nonvolatile memory device for erasure of the particular 'super' block and erasing the first and second selected blocks of the particular 'super' block so that erasure of the second block is performed without waiting for completion of the erasure of the first block; and indicating the status of the first and second nonvolatile memory devices to be busy during erasure of the first and second selected blocks, wherein the speed of erase operations in the digital system is substantially increased thereby increasing the overall performance of the digital system.

14 Claims, 6 Drawing Sheets

U.S. PATENT DOCUMENTS

| | | | |
|---|---|---|---|
| 4,450,559 | 5/1984 | Bond et al. | 371/10 |
| 4,456,971 | 6/1984 | Fukuda et al. | 364/900 |
| 4,498,146 | 2/1985 | Martinez | 364/900 |
| 4,525,839 | 7/1985 | Nozawa et al. | 371/38 |
| 4,616,311 | 10/1986 | Sato | 364/200 |
| 4,654,847 | 3/1987 | Dutton | 371/10 |
| 4,710,871 | 12/1987 | Belknap et al. | 364/200 |
| 4,746,998 | 5/1988 | Robinson et al. | 360/72.1 |
| 4,748,320 | 5/1988 | Yorimoto et al. | 235/492 |
| 4,757,474 | 7/1988 | Fukushi et al. | 365/189 |
| 4,774,700 | 9/1988 | Satoh et al. | 369/54 |
| 4,800,520 | 1/1989 | Iijima | 364/900 |
| 4,896,262 | 1/1990 | Wayama et al. | 364/200 |
| 4,914,529 | 4/1990 | Bonke | 360/48 |
| 4,920,518 | 4/1990 | Nakamura et al. | 365/228 |
| 4,924,331 | 5/1990 | Robinson et al. | 360/72.1 |
| 4,953,122 | 8/1990 | Williams | 364/900 |
| 5,070,474 | 12/1991 | Tuma et al. | 395/500 |
| 5,168,465 | 12/1992 | Harari | 257/320 |
| 5,198,380 | 3/1993 | Harari | 437/43 |
| 5,200,959 | 4/1993 | Gross et al. | 371/21.6 |
| 5,226,168 | 7/1993 | Kobayashi et al. | 395/800 |
| 5,268,318 | 12/1993 | Harari | 437/43 |
| 5,268,870 | 12/1993 | Harari | 365/218 |
| 5,270,979 | 12/1993 | Harari et al. | 365/218 |
| 5,293,560 | 3/1994 | Harari | 365/185 |
| 5,297,148 | 3/1994 | Harari et al. | 371/10.2 |
| 5,303,198 | 4/1994 | Adachi et al. | 365/218 |
| 5,315,541 | 5/1994 | Harari et al. | 365/63 |
| 5,337,275 | 8/1994 | Garner | 365/189.01 |
| 5,341,330 | 8/1994 | Wells et al. | 365/185 |
| 5,341,339 | 8/1994 | Wells | 365/218 |
| 5,353,256 | 10/1994 | Fandrich et al. | 365/230.03 |
| 5,357,475 | 10/1994 | Hasbun et al. | 365/218 |
| 5,369,615 | 11/1994 | Harari et al. | 365/218 |
| 5,388,083 | 2/1995 | Assar et al. | 365/218 |
| 5,396,468 | 3/1995 | Harari et al. | 365/218 |
| 5,418,752 | 5/1995 | Harari et al. | 365/218 |
| 5,422,842 | 6/1995 | Cernea et al. | 365/185 |
| 5,428,621 | 6/1995 | Mehrotra et al. | 371/21.4 |
| 5,430,859 | 7/1995 | Norman et al. | 395/425 |
| 5,434,825 | 7/1995 | Harari | 365/185 |
| 5,438,573 | 8/1995 | Mangan et al. | 371/10.3 |
| 5,471,478 | 11/1995 | Mangan et al. | 371/10.3 |
| 5,479,638 | 12/1995 | Assar et al. | 395/430 |
| 5,485,595 | 1/1996 | Assar et al. | 395/430 |
| 5,495,442 | 2/1996 | Cernea et al. | 365/185.03 |
| 5,504,760 | 4/1996 | Harari et al. | 371/40.1 |
| 5,508,971 | 4/1996 | Cernea et al. | 365/185.23 |
| 5,524,230 | 6/1996 | Sakaue et al. | 395/430 |
| 5,532,962 | 7/1996 | Auclair et al. | 365/201 |
| 5,532,964 | 7/1996 | Cernea et al. | 365/189.09 |
| 5,534,456 | 7/1996 | Yuan et al. | 437/43 |
| 5,535,328 | 7/1996 | Harari et al. | 395/182.05 |
| 5,544,118 | 8/1996 | Harari | 365/218 |
| 5,544,356 | 8/1996 | Robinson et al. | 395/600 |
| 5,554,553 | 9/1996 | Harari | 437/43 |
| 5,563,825 | 10/1996 | Cernea et al. | 365/185.18 |
| 5,566,314 | 10/1996 | DeMarco et al. | 395/430 |
| 5,568,439 | 10/1996 | Harari | 365/218 |
| 5,583,812 | 12/1996 | Harari | 365/185.33 |
| 5,592,420 | 1/1997 | Cernea et al. | 365/185.18 |
| 5,642,312 | 6/1997 | Harari | 365/185.33 |
| 5,663,901 | 9/1997 | Wallace et al. | 365/52 |
| 5,693,570 | 12/1997 | Cernea et al. | 437/205 |
| 5,712,819 | 1/1998 | Harari | 365/185.29 |
| 5,719,808 | 2/1998 | Harari et al. | 365/185.33 |
| 5,778,418 | 7/1998 | Auclair et al. | 711/101 |

FOREIGN PATENT DOCUMENTS

| | | | |
|---|---|---|---|
| 0 424 191 A2 | 4/1991 | European Pat. Off. | G06F 11/00 |
| 0 489 204 A1 | 6/1992 | European Pat. Off. | G11C 16/06 |
| 0 522 780 A2 | 1/1993 | European Pat. Off. | G06F 3/06 |
| 0 544 252 A2 | 6/1993 | European Pat. Off. | G11C 16/06 |
| 0 686 976 A2 | 12/1995 | European Pat. Off. | G11C 16/06 |
| 93 01908 | 8/1993 | France | G06F 12/02 |
| 59-45695 | 9/1982 | Japan | G11C 17/00 |
| 58-215794 | 12/1983 | Japan | G11C 17/00 |
| 58-215795 | 12/1983 | Japan | G11C 17/00 |
| 59-162695 | 9/1984 | Japan | G11C 17/00 |
| 61-96598 | 5/1986 | Japan | G11C 17/00 |
| 62-283496 | 12/1987 | Japan | G11C 17/00 |
| 62-283497 | 12/1987 | Japan | G11C 17/00 |
| 63-183700 | 7/1988 | Japan | G11C 17/00 |
| 4-332999 | 11/1992 | Japan | G11C 29/00 |
| 60-212900 | 10/1995 | Japan | G11C 29/00 |
| 84/00628 | 2/1984 | WIPO | G06F 11/20 |

SPACE MANAGEMENT FOR MANAGING HIGH CAPACITY NONVOLATILE MEMORY

CROSS REFERENCE TO RELATED APPLICATIONS

This application is a continuation of our prior U.S. patent application Ser. No. 09/283,728 entitled "SPACE MANAGEMENT FOR MANAGING HIGH CAPACITY NONVOLATILE MEMORY" filed Apr. 1, 1999 now U.S. Pat. No. 6,034,897.

BACKGROUND OF THE INVENTION

1. Field of the Invention

This invention relates to the field of digital systems employing non-volatile memory and particularly flash memory as mass storage for computers, digital cameras and the like.

2. Description of the Prior Art

Recently, solid state memory has gained popularity for use in replacing mass storage units in various technology areas such as computers, digital cameras, modems and the like. For example, in digital cameras, the use of solid state memory, such as flash memory, replaces conventional films.

Flash memory is generally provided in the form of semiconductor devices (or chips) with each device made of a large number of transistor memory cells and each cell being individually programmable. The programming (or writing) and erasing of such a memory cell is limited to a finite number of erase-write cycles, which basically determines the lifetime of the device. Furthermore, an inherent characteristic of flash memory cells is that they must be erased and verified for successful erase prior to being programmed.

With the use of flash memory, however, the area of memory that once contained information must first be erased prior to being re-programmed. In a flash memory device, write and erase cycles are generally slow and can significantly reduce the performance of a system utilizing flash memory as its mass storage.

In applications employing flash memory devices, such as personal computers and digital cameras, a host writes and reads information to the flash memory devices through a controller device, which is commonly in the form of a semiconductor device. Such information is organized in sectors with each sector including user data information and overhead information and being generally 512 bytes in length. The controller, upon receiving sector information from the host, during a host-commanded write operation, writes the information to the flash memory devices in accordance with a predetermined sector organization. While the host may be accessing multiple sectors, each sector is written to the flash devices one at a time.

Currently, in computers wherein large files such as commercial software and user programs are stored within flash memory and in digital cameras wherein large picture files are stored within flash devices, the files are written one sector at a time within flash. Due to the latency associated with each write operation, the performance of these systems when storing large quantities of information is limited.

In storing and/or retrieving a data file (data files may be any computer files including commercial software, user program, word processor software document, spread sheet file and the like), a computer (or host) system provides what is referred to as the logical block address indicating the location of where the host believes the data file to exist within the mass storage. The host-provided address may be in the form of cylinder, head and sector (CHS), which is converted to a logical block address format upon receipt by the controller. The same applies to digital camera applications. The controller then translates the logical block address (LBA) into a physical block address (PBA) and uses the latter to access the data file within flash memory. Each time a data file is changed, the latest version of the file is stored in an available (or 'unused') location within the flash memory that is identified by a new physical location (or new PBA). Upon using much of the free or available locations within the flash memory for updated files, an erase operation may be needed to make available 'old' locations for storage of additional information. Since erase operations are time-consuming (as are write operations), there is a trade-off as to the frequency of performing erase operations to the time expended for searching for free locations within the flash memory as more and more locations are used prior to the next erase operation.

A variety of different algorithms may be employed for determining when an erase operation(s) will take place and as a function thereof, where within the flash memory (mass storage) the next available free block is located for storing the data file. The space manager unit of the controller device performs this function.

Information in the nonvolatile memory or flash memory is stored under the direction of the controller and it is done so in the form of blocks. Thus, information that is stored in nonvolatile memory is organized in blocks and each block is uniquely addressable by the controller. Each block is further comprised of multiple sectors with each sector defining 512 bytes of storage space. In some prior art systems, during an erase operation, an entire block is erased whereas in other prior art systems, the sector may be erased. Each block is uniquely addressable for reading and writing information from and to the nonvolatile memory. Each sector includes information such as data, flags and Error Correction Codes (ECC). The address of a block within the nonvolatile memory is maintained within the respective block for use in reconstructing the addressing or mapping information associated with the nonvolatile memory after a power-down. This mapping information is the contents of a look-up-table maintained in volatile memory, as will now be further described.

The space manager unit of the controller device maintains a table of information regarding the location of the most recent data within the flash memory in addition to the location of information that is considered 'old' (information which has been superseded) and not yet erased and/or 'defective' (location can not be used for storing information due to some kind of defect) or 'used' (currently contains up-to-date information). This table of information is stored and updated in a volatile memory location such as RAM either within or outside of the controller device. Each time information is accessed by the host, the space manager table is used to find out the location of the information that is to be written and/or read from the flash memory devices.

The problem with prior art methods and apparatus using nonvolatile memory devices is that when, for example, a block of information within a particular nonvolatile memory device is being erased, another block within the same flash device cannot be erased. This is, in part, due to the nonvolatile memory devices being busy erasing the previous block. During the erase operation of the particular nonvolatile memory device, the Ready/Busy* signal is at logic state '0' indicating the particular nonvolatile memory device to be busy but this also means that another block within the same device cannot be erased. Consequently, each block of each nonvolatile memory device has to be erased serially, i.e. one at a time.

Erase operations of nonvolatile memory devices, such as flash devices, are generally time consuming thereby substantially degrading the overall performance of a system in which the nonvolatile memory is employed. Furthermore, as the number of blocks being accessed grows, there is further degradation of the system due to the even more lengthy process of erasing a large number of blocks. For example, generally, after an update (or a re-write operation) of a block, an erase operation is performed of an 'old' block and when only one block must be erased completely prior to performing erase of another block, the time spent for performing erase operations in general becomes excessive. The latter is due to the limitation of prior art systems that erase blocks serially, as discussed above.

There is therefore a need within digital systems using solid state memory such as flash devices to decrease the amount of time associated with erase operations thereby increasing system performance.

SUMMARY OF THE INVENTION

Briefly, an embodiment of the present invention includes a method and apparatus for use in a digital system having a host coupled to at least two nonvolatile memory devices. The host stores digital information in the nonvolatile memory devices and reads the stored digital information from the nonvolatile memory devices. The memory devices are organized into blocks of sectors of information. The method is for erasing digital information stored in the blocks of the nonvolatile memory devices and comprises assigning a predetermined number of blocks, in sequential order, to each of the nonvolatile memory devices, each block having a predetermined number of sectors. The method further comprises forming 'super' blocks, each 'super' block comprising a plurality of blocks, identifying a particular 'super' block having at least two blocks, a first block being located in a first nonvolatile memory device and a second block being located in a second nonvolatile memory device for erasure of the particular 'super' block and erasing the first and second selected blocks of the particular 'super' block so that erasure of the second block is performed without waiting for completion of the erasure of the first block; and for indicating the status of the first and second nonvolatile memory devices to be busy during erasure of the first and second selected blocks, wherein the speed of erase operations in the digital system is substantially increased thereby increasing the overall performance of the digital system.

The foregoing and other objects, features and advantages of the invention will be apparent from the following detailed description of the preferred embodiments which made reference to the several figures of the drawing.

IN THE DRAWING

DETAILED DESCRIPTION OF THE PREFERRED EMBODIMENTS

Figure 1:
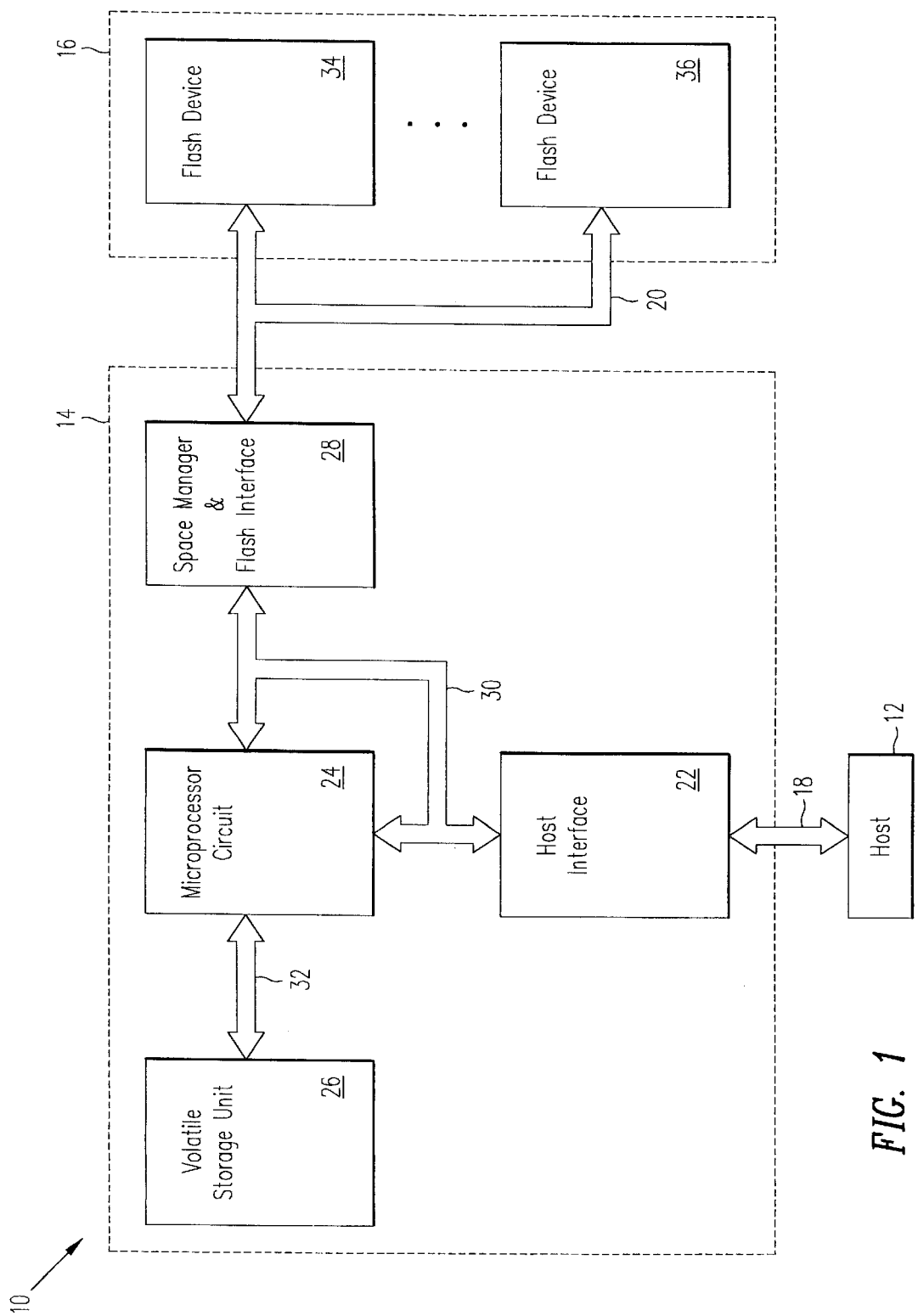
FIG. 1 shows a digital system in accordance with an embodiment of the present invention.

Referring now to FIG. 1, a digital system 10, which may be a part of a computer (personal computer (PC)), digital camera and the like is shown in accordance with an embodiment of the present invention to include a host 12, a controller device 14 and a nonvolatile memory unit 16. The host 12 is shown to be coupled to read information from and write information to the memory unit 16 under the direction of the controller device 14. The memory unit 16, as depicted, is comprised of at least two nonvolatile memory devices in accordance with the present invention. Each of the nonvolatile memory devices is an integrated circuit (or semiconductor device, as commonly referred to by the industry). The nonvolatile memory devices may be flash, EEPROM (Electronically Erasable Programmable Read Only Memory) or other type of solid state memory.

The host 12 is shown to communicate with the controller 14 through host bus 18 and the controller device 14 is shown coupled to the memory unit 16 through memory signals 20.

The controller device 14 is an integrated circuit (or semiconductor) shown to include a host interface circuit 22, a microprocessor circuit 24, a volatile storage unit 26 and a space manager/flash interface circuit 28. The host interface circuit 22 is for coupling the host 12 through host bus 18, which includes an address bus, a bi-directional data bus and control signals (not shown separately). Depending on the architecture of the host being employed, the host address and data busses may be comprised of a single bus carrying both address and data information by multiplexing address and data signals onto the same bus. It should be noted that the term bus as used herein includes multiple electrical conductors or signal lines. The host bus 18 may be a PCMCIA interface, an ATA interface or other kinds of interfaces employed by the industry.

The host interface circuit 22 is shown coupled to the host bus 18 and is further shown to be coupled through a microprocessor bus 30 to the microprocessor circuit 24. Microprocessor circuit 24 is further coupled to the space manager/flash interface circuit 28 through the microprocessor bus 30, which facilitates communication of address and data information and control signals therebetween. The microprocessor circuit 24 is coupled to read and write information to the volatile storage unit 26 through a volatile storage bus 32.

In one embodiment of the present invention, the microprocessor circuit 24 is an Intel 8051 processor and alternatively, the microprocessor unit 24 may be any general-purpose processor unit. The volatile storage unit 26 is generally a read-access memory (RAM) for storing firmware code that is executed by the microprocessor circuit 24. Information between the host 12 and the controller 14 is transferred through the host bus 18 and information between the controller 14 and the memory unit 16 is coupled through the memory signals 20. The memory unit 16 is comprised of two or more nonvolatile memory devices, such as 34 and 36. The size of each of the nonvolatile memory devices 34 and 36 may vary depending on the application of the digital system 10. Nonetheless, this size is generally referred to by bytes where each byte is 8 bits. For example, in one application, the size of the nonvolatile memory unit 16 is 160 MB (mega bytes) together, or 80 MB each. The nonvolatile memory devices 34 and 36 are of the memory type that preserve their contents even during a power-down. Typical examples of nonvolatile memory devices are flash or EEPROM devices comprised of floating gate cells and manufactured by companies such as Toshiba, Hitachi and the like.

While not shown in FIG. 1, the space manager/flash interface circuit 28 includes a space manager control unit 38, a flash interface circuit 40 and a space manager storage unit 42. The space manager unit 38, in one embodiment of the present invention, is comprised of a state machine for controlling the information that is stored in a look-up-table (LUT) maintained within the space manager storage unit 42. Alternatively, the functions of the space manager control unit 38 may be performed by other types of hardware and/or software as understood by those of ordinary skill in the art. The space manager storage unit 42 is of a volatile type of memory, such as RAM, for storing block addressing and status information within the LUT.

Still not shown in FIG. 1, the memory signals 20 include a flash address bus, a bi-directional flash data bus and flash control signals. Some of these signals will be further described with respect to other figures included herein.

In operation, the host 12 accesses the memory unit 16 from time to time and during performance of various operations such as reading and writing to the memory unit 16. In doing so, the host 12 provides an address identifying a location for reading or writing of data. The host-provided address is coupled onto the host bus 18 for use by the controller 14 in accessing or reading information to and from the memory unit 16. In one embodiment, the host-provided address is in the form of CHS (cylinder, head and sector). This type of addressing is adopted from systems using hard disks where such an addressing scheme was used to identify a particular location on the disk. With the advent of nonvolatile memory for storage of information however, the CHS address format need be converted to a value for identifying a location within the nonvolatile memory unit. Thus, when a CHS address is coupled onto the host bus 18, the controller 14 converts the same to a logical block address (LBA). The LBA is then coupled through the microprocessor bus 30 for use by the space manager/flash interface unit 28. Alternatively, the host 12 provides an LBA type of address to the controller 14, in which case, while conversion is still performed, it is not a CHS to LBA conversion. The latter conversion merely displaces the LBA, as is also performed when the former conversion, i.e. CHS to LBA is used. The reader will note that as previously discussed herein, a block is defined to include a predetermined number of sectors.

The manipulation and conversion of the addressing information from CHS to what ultimately becomes an address that is used to look up or store information in the memory unit 16 is important and will therefore be discussed in further detail. In the case where a CHS address is provided by the host to the controller 14, the latter converts the CHS to an LBA pursuant to the following equation:

$$LBA=[(Cylinder*Heads+Heads)*Sectors/Track]+(Sector-1) \quad (Eq. 1)$$

The asterisk (*) denotes a multiplication (or shift to the left in binary) operation, the slash (/) denotes a division (or shift to the right in binary) operation and the plus (+) obviously denotes an addition operation. The cluster size generally determines the requisite size of the memory unit 16 since the size of the space manager storage unit 42 is typically fixed. This will become apparent during a later discussion. The LBA calculation according to the equation shown above may be performed by hardware or firmware. In the case where firmware is used to calculate the LBA, the microprocessor 24 performs such function by execution of the firmware code stored in the volatile storage unit 26. In the case where hardware is used to calculate the LBA, a state machine block (not shown in FIG. 1) performs such a calculation.

After calculation of the LBA according to the equation hereinabove, the LBA is translated to a VLBA (Virtual Logical Block Address) value by masking certain least significant bits of the LBA. For example, in the case where 16 sectors per block is employed, the VLBA is calculated from the LBA by a logical 'AND' of the LBA with the hexadecimal value 0x3FFFF0. This essentially results in the LBA being preserved except for the 4 least significant bits thereof. In the case where 32 sectors per block are employed, the VLBA is calculated by a logic 'AND' of the LBA value with the hexadecimal value of 0x3FFFE0, which is effectively masking off the 5 least significant bits of the LBA and preserving the remaining bits, and so on. The translation of the LBA to VLBA is performed by the space manager/flash interface 28. This translation may be performed by either hardware or software.

The VLBA is then coupled onto the microprocessor bus 30 from the microprocessor 24 to the space manager control unit 38 of the space manager/flash interface circuit 28 where it is used to address the LUT of the space manager storage unit 42. In fact, the VLBA is used to address a particular location of the LUT wherefrom a VPBA (virtual physical block address) is retrieved. It should be noted that a particular LBA value may be used to point to various PBA values. For example, if the host wishes to write to a location that is identified by a particular LBA value, the particular LBA value is then used to look up a VPBA value in the LUT. This VPBA value may be, for example, '20' but the next time the host wishes to write to the same LBA-identified location, the VPBA value retrieved from the LUT may be '200' rather than '20'. The way in which this is done is with the use of certain flag information that is also maintained within the LUT. Briefly, the first time after an erase operation that a particular LBA location is being addressed by the host for writing thereto, the information is written and a flag field within the LUT corresponding the particular LBA is marked as 'used' so that the next time the host wishes to write to that same location prior to an erase operation, a different location within the memory unit 16 is identified by a different PBA for such writing. Accordingly, there is no one-to-one correspondence between the LBA and the PBA. For a further explanation of flag fields and the LBA and PBA LUT addressing, the reader is directed to a U.S. application filed on Mar. 31, 1997, entitled "Moving Sectors Within a Block of Information in a Flash Memory Mass Storage Architecture", the inventors of which are Petro Estakhri, Berhanu Iman and Ali R. Ganjuei and the disclosure of which is herein incorporated by reference as though set forth in full.

In PC applications, a block of information is typically a sector as employed in conventional hard disk drives, with each sector typically having 512 bytes of data, although other-sized sectors may be similarly employed.

Microprocessor 24 executes instructions in the form of program code from the volatile memory unit 26 (such as ROM (read-only memory) or RAM (read-and-write memory)) located either within or outside of the microprocessor 24. The microprocessor 24 further instructs the space manager control unit 38 to use the LBA, originated by a CHS value provided by the host, to find the next unused (or free) addressable storage block location available within the memory unit 16. During a host write operation, this unused block location is stored in the LUT and during a host read operation, this unused block location is read from the LUT. The address value identifying the a location within the memory unit 16, as stored within the LUT, is referred to as a Virtual Physical Block Address (VPBA). The space manager control unit 38 may employ any one of a variety of algorithms to find the next available (or free) block located within the flash memory devices. An example of a space manager is disclosed in an earlier-issued patent, U.S. Pat. No. 5,485,595, entitled "Flash Memory Mass Storage Architecture Incorporating Wear Level Technique Without Using Cam Cells", issued on Jan. 16, 1996 with the inventors being Mahmud Assar, Petro Estakhri, Siamack Nemazie and Mahmood Mozaffari, the disclosure of which is herein incorporated by reference as though set forth in full. The reader is particularly directed to FIGS. 11–13 and discussions regarding the same. In alternative embodiments, however, other space management methods and apparatus may likewise be employed by the present invention.

The VLBA value is ultimately used to look up a VPBA value from the LUT. The LUT is comprised of rows and columns with each row being addressed by a VLBA value. During a read operation, the VLBA value is used to address a particular row of the LUT for retrieving therefrom, the VPBA, which includes certain flag information. During a write operation, the VLBA is used to address a particular row of the LUT for storing a VPBA value including certain flag information. The VPBA is ultimately translated to a Physical Block Address (PBA) for identifying a particular sector location within the memory unit 16.

The mapping of address information is perhaps best understood with the use of an example.

TABLE 1

160MB, 64 sectors/block
LBA
    xxxx,xCCC,BBBB,BBBB,BBCC,SSSS
PBA
    Xxxx,xCCC,CCBB,BBBB,BBxx,xxxx
VPBA
    Xxxx,UODC,CCCC,BBBB,BBBB,xxxx
For 64Mbit Flash 16 sector per Block
C:Chip, B:Block, S:Sector, U:Used, O:Old, D:Defect Table 1, above, shows an example of such an address mapping where a nonvolatile memory unit size of 160 MB is used and further where a 'super' block includes 64 sectors. A 'super' block is a block comprising of a plurality of blocks with each block residing in a location within a flash device that is the same relative location as that of the remaining blocks in the remaining flash device. In other words, blocks of a super block are positioned in like-locations within each of the flash devices and each block of a super block is within one flash device thereby positioning the blocks of a super block in-parallel with respect to each other.

An LBA, derived, if need be, from a CHS value sent by the host 12 is calculated in accordance with the equation above. The LBA value is then coupled onto the microprocessor bus 30 by the microprocessor 24 for use by the space manager/flash interface 28 where it is translated to a VLBA address. The LBA value shown in Table 1 includes 4 bits of sector information, 10 bits of block information and 5 bits of chip select information. Four bits of sector indicates the use of 16 sectors per block since 2 to the power of 4 equals 16. The VLBA is derived by masking the sector bits (the masked sector bits will be referred to as sector offset value), which in this example include 4 bits. The block and chip select information remain the same. The chip select bits are used to select a particular one of the plurality of nonvolatile memory devices included within the memory unit 16, such as one of the devices 34 or 36. The block information identifies a particular block within the selected nonvolatile memory device.

In Table 1, the VPBA value is shown to include 4 least significant bits (LSBs) as 'don't care' bits, which indicates that those bits carry no meaningful information, followed by eight block information bits and five chip select bits and three flag bits. The three flag bits are shown as 'UOD', respectively. As indicated in the key portion of the Table 1, 'U' indicates a 'used' flag, 'O' stands for 'old' flag and 'D' stands for 'defect' flag. Similarly, 'C's indicate bits that carry chip select information while 'B's indicate bits that carry block information and 'S's carry sector information. As earlier noted, the chip select information is used for addressing a particular nonvolatile memory device within the memory unit 16 while block information is used for identifying a particular block within the selected nonvolatile memory device and sector information is used for identifying a sector, although the latter is not used by the LUT, as the sector bits are masked.

In Table 1, the VPBA is converted to a PBA value by shifting the VPBA value to the left so as to eliminate flag information and by appending the sector offset value. There are a number of '0's appended, as LSBs, to the PBA in order to account for expansion of the size of the memory unit 16.

The size of the LUT or the size of the space manager storage unit 42 (in FIG. 1) is generally fixed. In one embodiment of the present invention, the LUT has 5120 rows or entries with each row or entry being 24 bits wide. Accordingly, since the LUT size remains the same, the size of the cluster, or the number of sectors per block, dictates the size of the memory unit 16 being employed. The size of the memory unit 16 is often referred to as the memory capacity. In prior art systems, the size of each block (in terms of number of sectors, or cluster size) is a determination of the size of the requisite nonvolatile memory capacity. Consider the information provided in the following Table 2 for example:

TABLE 2

| Cluster Size | SPM Entry | Nonvolatile Memory Capacity |
| --- | --- | --- |
| 16 sectors | 5120 | 40MB (5120 * 8KB) |
| 32 sectors | 5120 | 80MB (5120 * 16KB) |
| 64 sectors | 5120 | 160MB (5120 * 32KB) |

The cluster size, in Table 2, as discussed earlier, represents the number of sectors in a block. For example, in prior art systems, where a 40 MB nonvolatile memory capacity is being employed, each block includes 16 sectors. Whereas, for a 80 MB capacity, 32 sectors per block (or cluster size) is employed. This is again, in part, due to the number of LUT entries remaining the same, i.e. 5120. Additionally, blocks are numbered sequentially in the nonvolatile memory unit 16 and blocks are erased sequentially by selecting a particular nonvolatile memory devices among the devices within the memory unit 16, issuing an erase command followed by the address of the block to be erased and subsequently verifying whether or not the erase operation was successful by reading the contents of the erased block and comparing it to an all '1's value. As is understood by those skilled in the art, successful erasure of flash or nonvolatile memory cells entails programming the cells to a logic state of '1'. Once erased, a cell can be written to but only once before it must be erased in order to be capable of being re-written.

It was the inventors' intention to be able to use a larger nonvolatile memory capacity while decreasing the time associated with erase operations. Accordingly, the present invention introduces the use of 'super' blocks for addressing of the nonvolatile memory unit 16. In this respect, a 'super' block is defined by a number of blocks that are in like locations of the different nonvolatile memory devices and residing in-parallel with respect to each other. According to the information provided in the following Table 3, below,

TABLE 3

Figure 2:
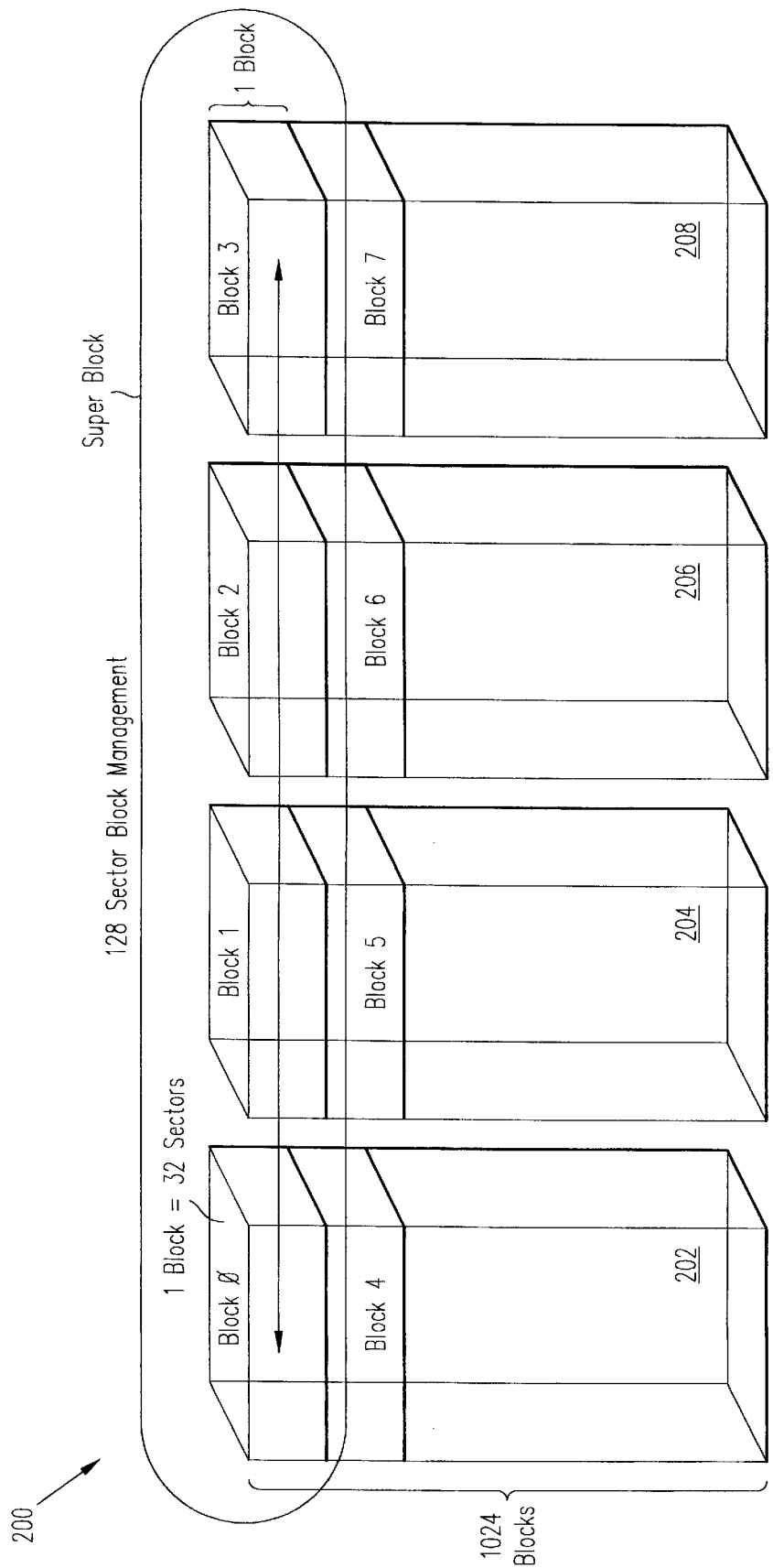
FIG. 2 shows an example of a flash memory unit as may be employed in the digital system of FIG. 1.

| Cluster Size | SPM Entry | Nonvolatile Memory Capacity |
|---|---|---|
| 4 * 16 sector | 5120 | 160MB (64-Mbit flash devices) |
| 4 * 32 sectors | 5120 | 320MB (128/256-Mbit flash devices) | the SPM Entry or LUT rows remain the same, i.e. 5120 but the intent is to have a 320 Mbyte nonvolatile memory capacity size, i.e. this is the total size of the memory unit 16. The memory unit 16 is then managed as 128 sectors/cluster. For example, according to the above, if a block is defined to include 16 sectors, a 'super' block will include 8 * 16 or 128 sectors with each 16-sector block being stored in one nonvolatile memory device and eight such nonvolatile memory devices being used in-parallel to define 8 blocks. This is perhaps best understood using an example to show the management of the memory unit 16 when using 32 sectors/block and a 'super' block having 4 blocks, as shown in FIG. 2. But before this is done, it should be understood that in Table 3, in the Cluster Size column, the number of sectors defines an erasable block. For example, in the first row of that column, an erasable block consists of 16 sectors and in the second row of that column, an erasable block is shown to consist of 32 sectors and so on. Furthermore, the Nonvolatile Memory Capacity column reflects the total capacity of the memory unit 16 and the flash devices are the nonvolatile memory devices within the memory unit 16. For example, in the first column of the Table 3, a total memory size of 160 MB is made up of twenty 8 MB-flash devices.

Referring now to FIG. 2, a flash memory unit 200 is shown to include 4 flash memory devices, 202–208. Using the example of a 320 MB memory capacity and 32 sectors per block, a super block then includes 4 blocks. A super block is denoted in FIG. 2 by the reference number 210 and as shown spreads over 4 flash memory devices. Blocks are numbered horizontally through the flash memory devices 202–208 such that, for example, the blocks included within the first super block, i.e. blocks 0–3, are each stored within the first block row of each of the flash memory devices 202–208, respectively. Similarly, blocks 4–7, which belong to the second super block, are stored within the second block row of the flash devices 202–208, respectively. Each of the flash devices 202–208 is shown to include 1024 block rows. Each block row is a storage space of 32 sectors * 512 bytes or 16 KB since each sector is 512 bytes.

An entire super block is erased as a unit during an erase operation. For example, if the first super block is to be erased, the flash device 202 is first selected and an erase operation command is issued along with an address identifying the first block of the flash device 202. Next, the second flash device, or flash device 204, is selected, followed by another erase operation command and an address identifying the first block of the flash device 204 (this value will be the same as the value used in identifying the first block of the flash device 202). Next, flash device 206 is selected and a read operation command is issued in the same manner as is done with respect to the flash device 208. At the completion of these operations, a 'read status' command is performed by issuing a read status command to check for the erase operation being completed without errors, i.e., checking for the contents of the erased blocks of each of the flash devices 202–208 being at logic state '1' and if so, the erased blocks are used for further writing thereto.

It should be noted that an erase operation is performed under the direction of the controller 14 (in FIG. 1). The signals used for coupling information between the controller 14 and the memory unit 16, i.e. memory signals 18, include various address, data and control signals for effectuating not only erase but also read and write operations (the latter two operations having been initiated by the host 12). Some of these signals included within the memory signals 18 will be referred to in the following discussion with respect to FIG. 3 and shown therein.

Figure 3:
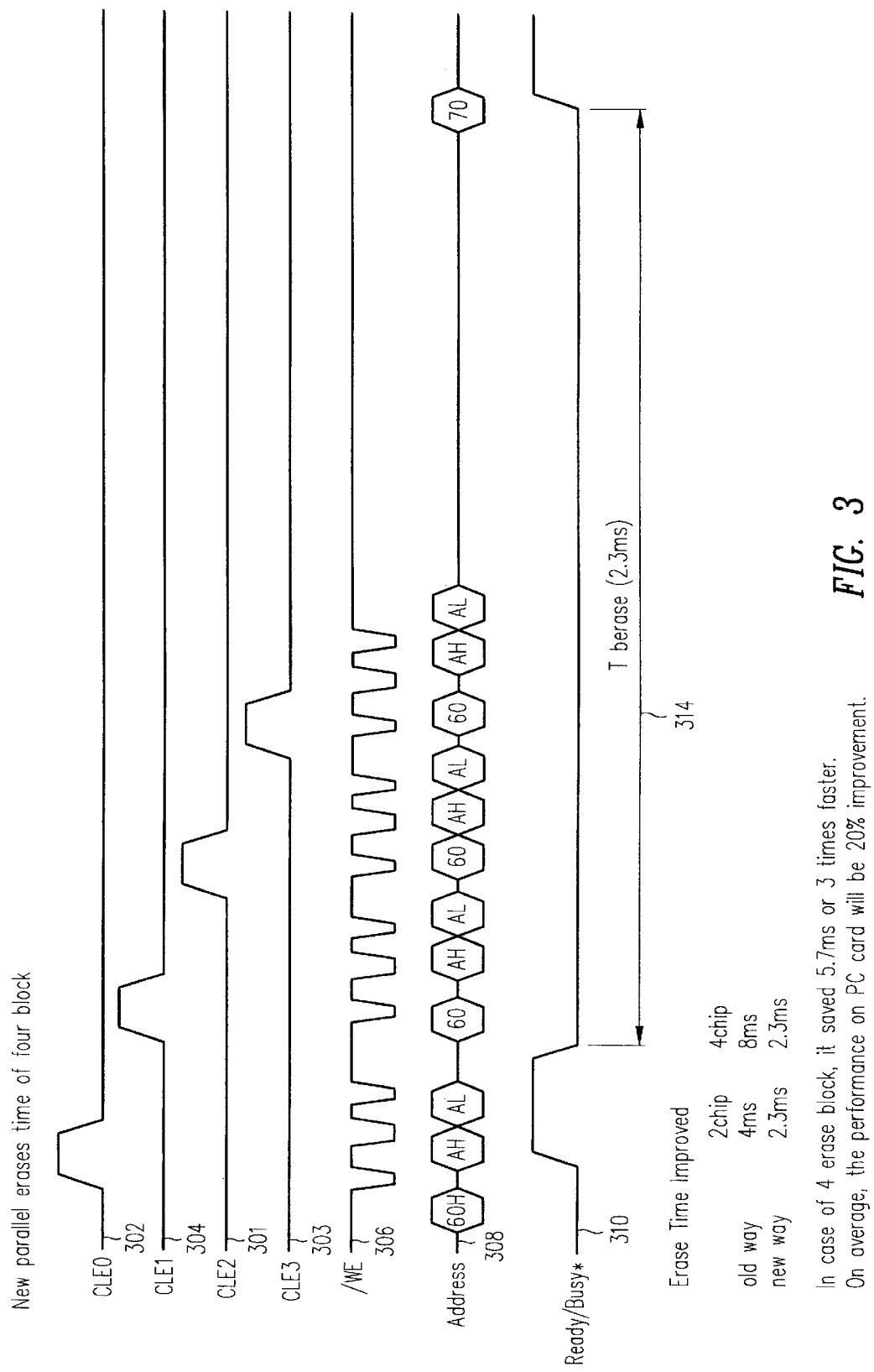
FIG. 3 depicts a timing diagram of the operation of a digital system in accordance with an example embodiment of the present invention.

The sequence of activities during an erase operation is shown in a timing diagram in FIG. 3, as an example, where two flash devices are employed. This may be the case where a block includes 64 sectors to form 160 MB nonvolatile memory capacity shown in Table 3 above.

In FIG. 3, the signals, CLE0 302, CLE1 304, CLE2 301 and CLE3 303, /WE 306, address 308, Read/Busy* 310 are shown as being included in the memory signals 18 (in FIG. 1). This example assumes there are four flash devices in the memory unit 16 (in FIG. 1). The signals 302, 304, 301 and 303 are chip enable or chip select signals that select one of the four flash devices when active (active in this example refers to a logical state of '1'). The /WE 306 signal is a write enable signal that is activated whenever address or data is being written to one of the flash devices. Activated of the 306 signal is a logic state of '0'. The address signals 308 provide the command and address portions of an operation. The address being the address of a block within a flash device and the command being one of read, write or erase operations. In the sequence of events, a command is first provided by the controller 12 through the address signals 308 to the memory unit 16, followed by the address of the block, in byte form, with the high byte being transmitted first followed by the low byte. The Ready/Busy* signal, 310, indicates whether a corresponding flash device is ready or busy. At logic state '1', the Ready/Busy* signal indicates that the corresponding flash device is ready for being written thereto, read from or erased, whereas, a logic state of '0' indicates that the corresponding flash device is busy and operation thereupon is not allowed.

In the example of FIG. 3, since there are four flash devices, a first, second, third and fourth flash devices (to which the signals 302, 304, 301 and 303 correspond, respectively), a super block is comprised of four blocks so that an erase operation includes erasing four blocks that are located in the same position within the four flash devices.

When an erase operation takes place in accordance with the present invention, the CLE0 signal 302 is activated and an erase command is coupled onto the address signals 308 (this is indicated by the value '60' in hexadecimal notation in FIG. 3). When so doing, the /WE signal 306 is asserted or activated. Furthermore, with the assertion of the CLE0 signal 302, the first flash device is enabled. Next, the CLE1 signal 304 is activated in order to enable the second flash device and the address of the block being erased is coupled onto the address signals 308, followed by causing the signal 310 to go to a logic state of '0' to indicate that the first flash device is now busy. Next, another erase command is issued, again indicated by the value '60' coupled onto the address signals 308, which is followed by the address of the block within the second flash device that is being erased. Note that as previously indicated this address is the same as the address that followed the previous erase command '60'. This is followed by the activation of the CLE2 and CLE3 signals, respectively in the same manner as is done with respect to the CLE0 and CLE1 signals and an erase command is issued in the same manner as well. Thereafter, the Ready/Busy* signal 310 is asserted or activated to indicate that the second flash device is busy and then a read command, shown by the value '70' on the address signals 308, is issued in order to verify that the erase operation was successful.

Note that in the present invention, a super block is being erased during an erase operation with a super block including a plurality blocks, as determined by the sector size of a block. It has been the inventors' experience that the time frame, indicated by reference number 314 in FIG. 3, when the flash devices are busy being erased, is 2.3 milliseconds in accordance with the present invention when four flash devices are employed, whereas the same time frame is 8 milliseconds for prior art erase operations. This results in an overall system performance improvement of approximately 20%.

When using two flash chips, the inventors' experience has been that the time for performing an erase operation, measured as indicated by 314 but for two devices, is reduced from 4 to 2.3 milliseconds in accordance with the present invention. In fact, the more flash devices being employed, the more time is saved for performing an erase operation with the use of the structure and methods of the present invention.

To give the reader some perspective regarding the relationship between the PBA (in Table 1 for example) and the signals shown in FIG. 3, the chip select signals and other addressing information, such as block and sector address are derived from the PBA. As noted with respect to Table 1 earlier, 'C's indicate chip select and if only two flash devices are being employed, CLE0 and CLE1 signals are developed from the value of the 'C's. In this example, a two-bit (or 'C's) would be required and if these two bits are at logic state '0', then the CLE0 signal is activated and if they are at logic state '1', then the CLE1 signal is activated and if they are at logic state '2', the CLE2 signal is activated and if they are at logic state '3', the CLE3 signal is activated. Similarly, the 'B's and 'S's form the address signals 308.

Figure 4A:
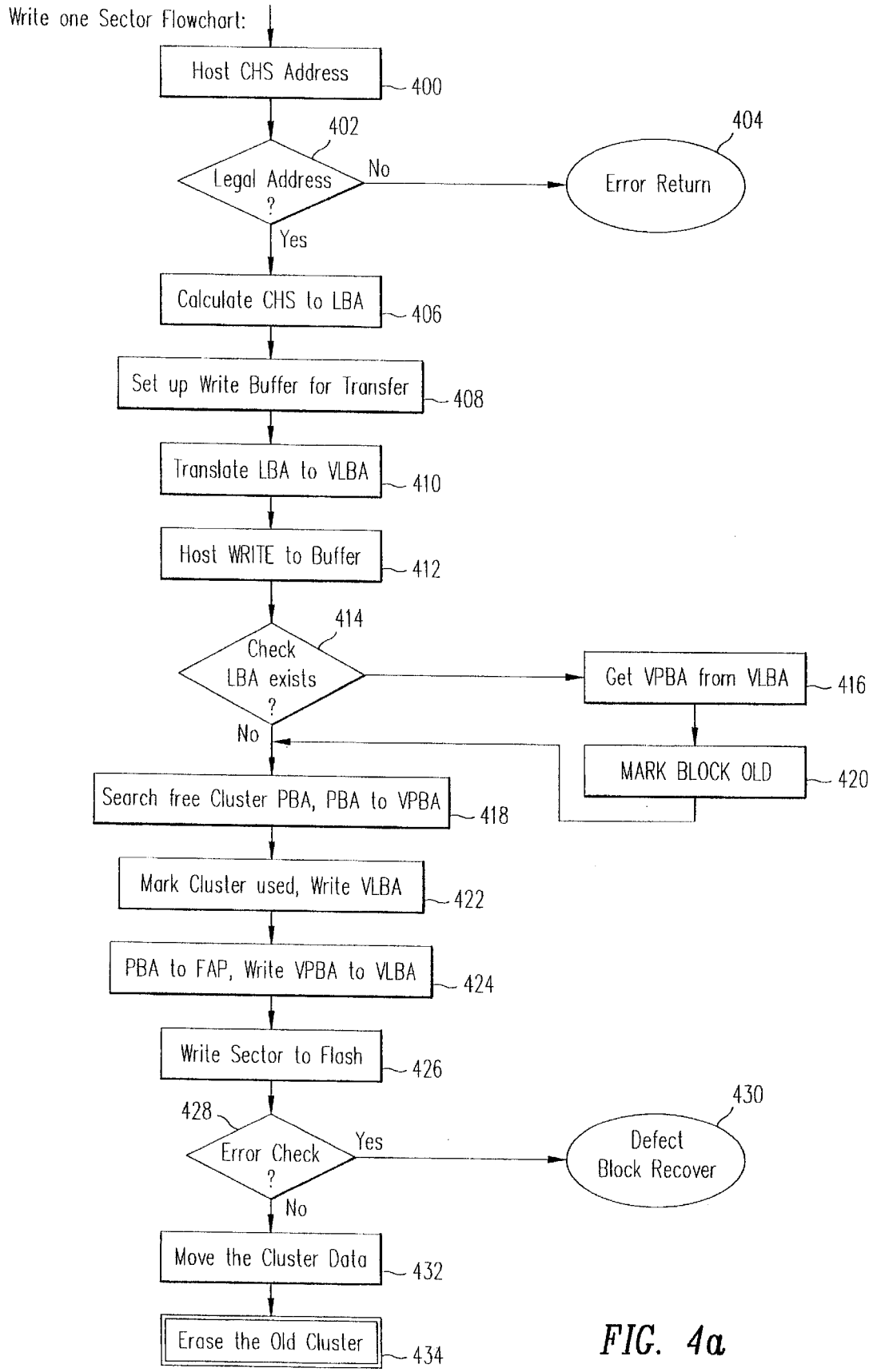
FIGS. 4a and 4b illustrate a flow chart of the steps performed by the microprocessor circuit 24.
Figure 4B:
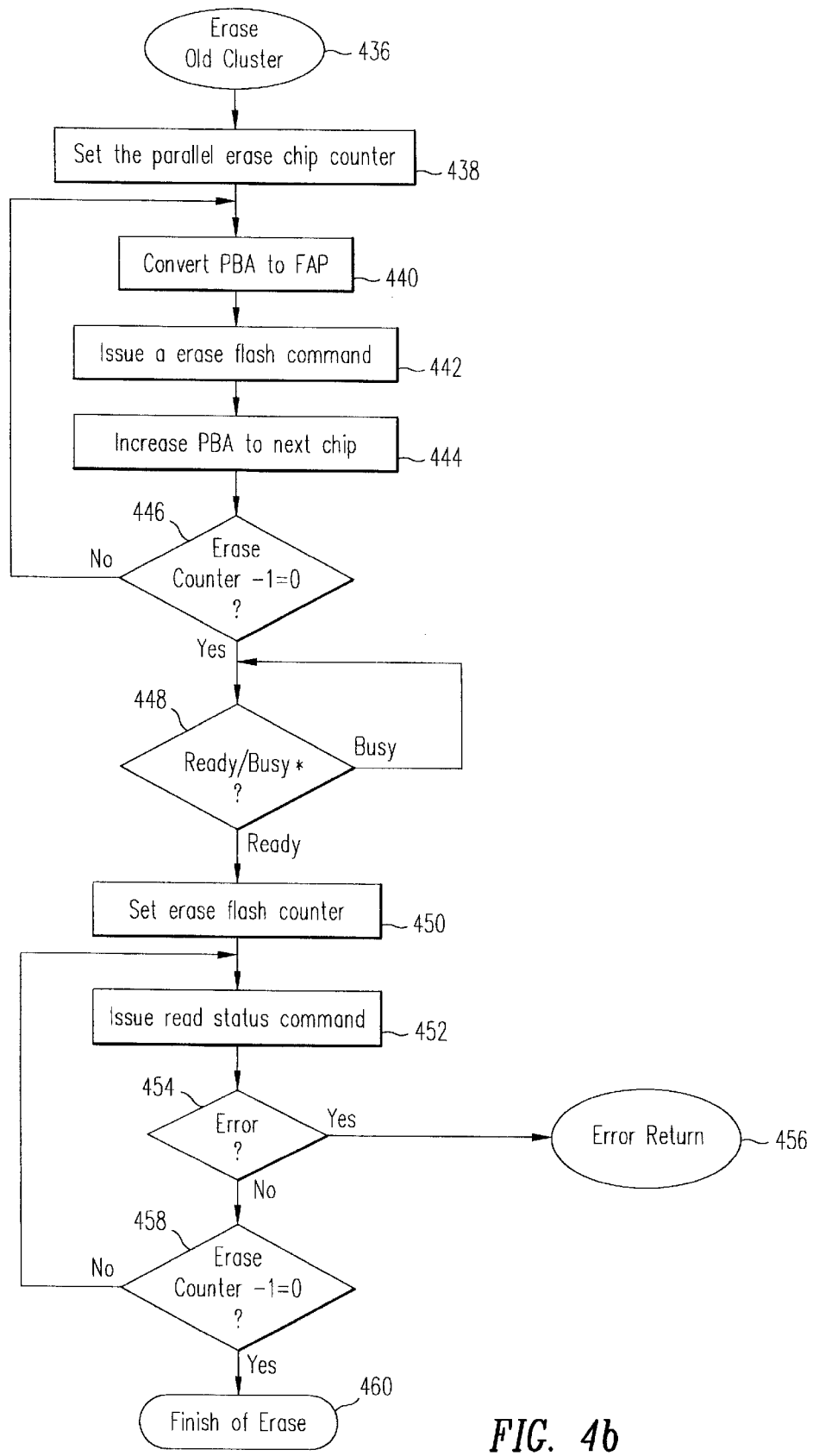

FIGS. 4a and 4b illustrate a flow chart showing the steps performed by the controller 14 (shown in FIG. 1) when writing one sector of information to the memory unit 16 (shown in FIG. 1). These steps may be performed by hardware or software (firmware). In one embodiment of the present invention, these steps are performed by the microprocessor circuit 24 by executing the firmware code stored in the volatile storage unit 26.

In FIG. 4a, at step 400, the host 12 (in FIG. 1) sends and the controller 14 receives a CHS address where the host is interested in writing data within the memory unit 16. The controller 14 checks the received CHS address at 402 to determine whether or not the address is valid. Upon power-on, the host will issue an identification command. This command will return memory card parameters (maximum cylinder, head, sector and track information including maximum LBA value). If the received CHS address is not a valid address, the controller 14 returns an error message back to the host. If on the other hand, the received address is valid, the process continues to step 406.

At step 406, the controller 14 calculates a LBA from the CHS address that was sent by the host. This calculation is done in accordance with equation 1 as recited hereinabove. Next, at step 408, a particular location of buffer is preserved for storing the data that is to be later programmed into the memory unit 16. This particular buffer area is not shown in FIG. 1 although it is composed of RAM. At step 410, the LBA is translated to VLBA. This is done by logically 'ANDing' the LBA with a hexadecimal value '0x3FFFF0H.' Essentially by doing so all of the bits in the LBA are preserved except for the four least significant bits. This is for the case where 16 sectors per block are employed. In the case where there are 32 sectors per block being used, the VLBA is calculated by logically 'ANDing' the LBA by the hexadecimal value 0x3FFFE0H. This preserves the LBA except for the five least significant bits, and in the case where there are 64 sectors per block, the VLBA is calculated by logically 'ANDing' the LBA by the hexadecimal value 0x3FFFC0H where all of the LBA bits are preserved except for the six least significant bits thereof. In cases where other sector sizes are being employed the calculation of VLBA is performed in a similar fashion.

At step 412, in FIG. 4a, the data that is to be written to the memory unit 16 is written by the host to a buffer located within the controller. At 414, the VLBA is checked to determine whether the address that the host is currently interested in writing to has been previously written. If so, that is, if the address is one that has been previously written, then at step 416 the VPBA is obtained from the LUT using the VLBA as explained hereinabove. The process then continues to step 420 where the block that was checked at 414 is marked as 'old' and the process then continues to step 418.

The sector information is that portion of the LBA that was earlier masked. In other words, the four least significant bits that were masked at step 410 are now appended to the VPBA to obtain PBA. Referring back to 414, if the LBA is not one that was previously written, then at step 418, which is where the process continues from step 420 as well as from 414, a search is performed by the space manager to obtain a free block for writing thereto. At step 422, the 'used' flag is set to indicate that the block is now in use and contains data and then a write operation is performed to write the data into the appropriate VPBA. At step 424, the PBA is converted to a FAP (flash address pointer) value.

The FAP serves as a value that identifies the particular chip, the non-volatile device, within the memory unit 16 being written to and the particular sector therein that is being written thereto. For example, the FAP value is broken down such that the four most significant bits of the PBA value indicate the chip select. The next nine bits indicate the sector select value and the least four significant bits of the PBA indicate the offset. In this example, the FAP has a 17 bit value.

At step 426, data is written to the appropriate sector, as defined by the FAP, of one of the non-volatile memory devices of the memory unit 16, and at step 428 a check is performed for errors That is, the hardware or firmware will issue a command to read the flash status and if the flash reports that the write operation completed successfully, there is no error reported, otherwise, failure to successfully program the flash device is reported as an error.

If the outcome of the error check at step 428 is such that an error is detected, the process continues to 430 where the block is considered defective and designated as no longer being used and another block is searched for writing thereto. If, on the other hand, the error check at step 428 is determined to yield a result where no errors are detected the process continues to step 432 where the remainder of the cluster or block is moved to the block where the host data was written, and at step 434 the old cluster or block is erased.

In FIG. 4b, after the old cluster or block is erased again as shown at step 436, the process continues to step 438 where the parallel erase chip counter is set. Thereafter, at 440, the PBA value is converted to FAP and at step 442 an erase flash command is issued by the controller 14. At step 444, the PBA value is increased to indicate the next nonvolatile memory device within the memory unit 16 and the erase counter which was set at step 438 is decremented by one at step 446 and checked as to whether it is equal to zero after it has been decremented. If at step 446 it is determined that the erase counter is not equal to zero the process goes back to step 440 and continues on through steps 440 through 446 until the erase counter is equal to zero. Once the erase counter is equal to zero the process continues to 448. The Ready/Busy* signal 310 is checked. If the signal indicates that the memory unit 16 is busy, in other words, if the Ready/Busy* signal 310 is zero, the process continues back to step 448 and loops onto itself until the signal 310 indicates ready, and then continues to step 450.

Next the process continues to step 450 where the erase counter is set. Thereafter, at step 452 the read status command is issued and the process continues to 454 where error is checked therefor. If no errors are reported the process continues to step 458. If an error exists the test continues to 456 where an error message is returned. At step 458, the erase counter that was set at step 450 is decremented and checked against zero. If the erase counter is equal to zero the process continues to 460 where essentially the erase operation is completed, and if the erase counter is not equal to zero after it has been decremented, the process continues to step 452 where steps 452 through 458 are repeated until the erase counter is set equal to zero. This completes the steps performed during a write operation of the sector in accordance with an embodiment of the present invention.

Figure 5:
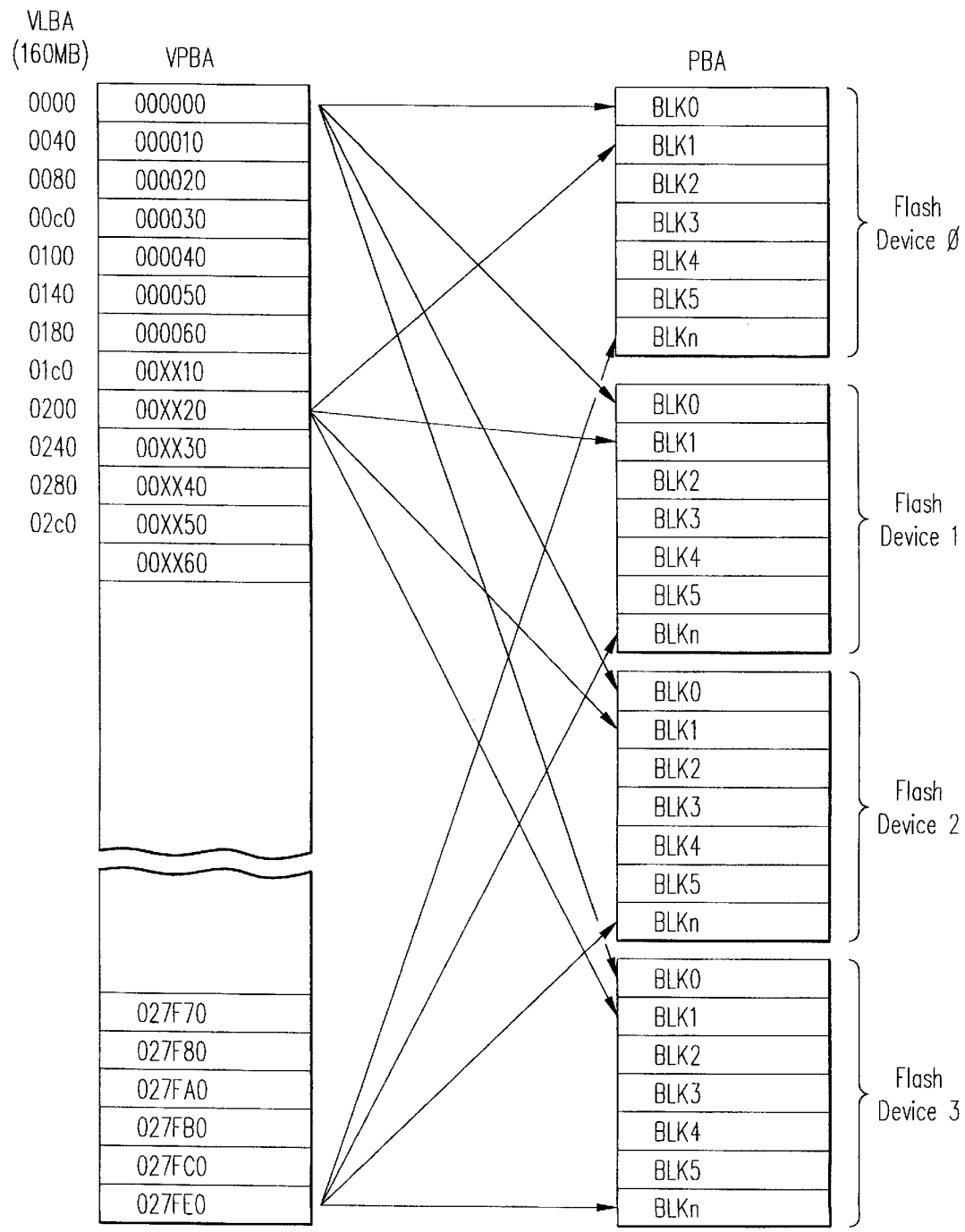
FIG. 5 shows an example of the contents of the LUT, maintained in the space manager/flash interface unit 28 of FIG. 1, as it relates to the block information maintained in the memory unit 16.

FIG. 5 shows an example of the contents of the LUT as it relates to the memory unit 16. In this example a 160 MB memory unit is employed and on the left hand side of FIG. 5 there is shown a column that is the VLBA whose values are used to look up information in the LUT. In the LUT, there is maintained the VPBA information. Each of the VLBAs corresponds to a VPBA. Each of the VPBA values corresponds to four blocks that make up a super block within the flash devices of the memory unit 16 which is shown on the right hand side of FIG. 5 under the PBA column. For example, a VLBA value of zero corresponds to a VPBA value of zero which then corresponds to four blocks that are BLK0. Each block will be within one flash or non-volatile memory device. This is indicated by the arrows extending from VPBA value zero which is the first entry in the LUT to each of the flash devices 0–3. As another example, a VLBA value of 200 in hexadecimal notation corresponds to VPBA value of 20 in hexadecimal notation which is then used to point to block one of each of the flash devices zero through three, or each of the four flash devices. Each flash device has blocks therein. It should also be noted that while not shown in FIG. 5 the FAP value is calculated from the PBA value and appended to the LBA offset value.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method for use in a digital system having a host coupled to at least two nonvolatile memory devices, the host for storing digital information in the nonvolatile memory devices and reading the stored digital information from the nonvolatile memory devices, the memory devices being organized into blocks of sectors of information, the method for erasing digital information stored in the blocks of the nonvolatile memory devices and comprising:

a. assigning a predetermined number of blocks, in sequential order, to each of the nonvolatile memory devices, each block having a predetermined number of sectors;

b. forming 'super' blocks, each 'super' block comprising a plurality of blocks;

c. identifying a particular 'super' block having at least two blocks, a first block being located in a first nonvolatile memory device and a second block being located in a second nonvolatile memory device for erasure of the particular 'super' block;

d. erasing the first and second selected blocks of the particular 'super' block so that erasure of the second block is performed without waiting for completion of the erasure of the first block; and e. indicating the status of the first and second nonvolatile memory devices to be busy during erasure of the first and second selected blocks, wherein the speed of erase operations in the digital system is substantially increased thereby increasing the overall performance of the digital system.

2. A method for use in a digital system as recited in claim 1 further including the steps of setting an erase counter equal to the number of blocks within a 'super' block and decrementing the erase counter after each of the initiating steps.

3. A method for use in a digital system as recited in claim 1 further including the steps of first selecting the first block within the first nonvolatile memory device from the particular 'super' block for erasure thereof and second selecting a second block within the second nonvolatile memory device from the particular 'super' block for erasure thereof.

4. A method for use in a digital system as recited in claim 3 wherein upon the value indicated by the erase counter reaching '0', checking for completion of the erasure of all of the blocks within the particular 'super' block.

5. A method for use in a digital system as recited in claim 1 wherein during the indicating step, setting a Ready/Busy* signal for indicating that the nonvolatile memory unit is busy upon starting the erase operation on the first nonvolatile memory device and upon completion of the erase operation on the last nonvolatile memory device of the nonvolatile memory unit, resetting the Ready/Busy* signal for indicating that the nonvolatile memory unit is no longer busy.

6. A method for use in a digital system as recited in claim 1 further including the step of completing erasing of all of the selected blocks within the particular 'super' block and thereafter verifying successful completion of the selected blocks of the particular 'super' block.

7. A method for use in a digital system as recited in claim 6 wherein said verifying step includes the step of issuing a read status command.

8. A method for use in a digital system as recited in claim 1 wherein the particular 'super' block includes more than two blocks and the method further includes the steps of selecting the more than two blocks for erasure thereof, erasing the same and upon completion of the erasure, verifying the erasure.

9. A digital system including a host and at least two nonvolatile memory devices, the host for storing digital information in the nonvolatile memory devices and reading the stored digital information from the nonvolatile memory devices, the memory devices being organized into blocks of sectors of information, the digital system comprising:

a space manager circuit responsive to address information from the host and operative to read, write or erase information in the nonvolatile memory devices based upon the host address information, the space manager for assigning a predetermined number of blocks, in sequential order, to each of the nonvolatile memory devices, for forming 'super' blocks, each 'super' block having a plurality of blocks and wherein blocks of the same sequential number in each of the nonvolatile memory devices are in like position relative to each other, the space manager circuit further for identifying a particular 'super' block having at least two blocks, a first block being located in a first nonvolatile memory device and a second block being located in a second nonvolatile memory device, for erasing the first and second blocks so that erasure of the second block is performed without waiting for completion of the erasure of the first block, and for indicating the status of the first and second nonvolatile memory devices to be busy during erasure of the first and second selected blocks, wherein the speed of erase operations is substantially increased thereby increasing the overall performance of the digital system.

10. A digital system as recited in claim 9 including a flag field for indicating the status of the particular 'super' block for use in identifying the particular 'super' block as being 'old' and ready for erasure thereof.

11. A digital system as recited in claim 10 further including an erase counter and for setting the erase counter equal to the number of blocks within a 'super' block prior to the start of the erase operation on the particular 'super' block and decrementing the erase counter after starting erasure of the blocks of the particular 'super' block.

12. A digital system as recited in claim 10 wherein the space manager circuit further for first selecting the first block within the first nonvolatile memory device from the particular 'super' block for erasure thereof and for second selecting the second block within the second nonvolatile memory device for erasure thereof.

13. A digital system as recited in claim 9 wherein the nonvolatile memory devices are flash chips.

14. A method for use in a digital system having a host coupled to a nonvolatile memory device, the host for storing digital information in the nonvolatile memory device and reading the stored digital information from the nonvolatile memory device, the memory unit being organized into blocks of sectors of information, the method for erasing digital information stored in the blocks of the nonvolatile memory device and comprising:

a. assigning a predetermined number of blocks, in sequential order, to the nonvolatile memory device, each block having a predetermined number of sectors;

b. forming 'super' blocks, each 'super' block comprising a plurality of blocks;

c. identifying a particular 'super' block having at least two blocks, a first block and a second block for erasure of the particular 'super' block;

d. erasing the first and second selected blocks of the particular 'super' block so that erasure of the second block is performed without waiting for completion of the erasure of the first block; and e. indicating the status of the first and second nonvolatile memory devices to be busy during erasure of the first and second selected blocks, wherein the speed of erase operations in the digital system is substantially increased thereby increasing the overall performance of the digital system.

* * * * *